United States Patent [19]
Alzati et al.

[11] Patent Number: 5,770,967
[45] Date of Patent: Jun. 23, 1998

[54] DEVICE AND METHOD FOR CONTROLLING A POWER SWITCH

[75] Inventors: Angelo Alzati; Aldo Novelli, both of Milan, Italy

[73] Assignee: SGS-Thomson Microelectronics S.r.l., Agrate Brianza, Italy

[21] Appl. No.: 594,707

[22] Filed: Jan. 31, 1996

[30] Foreign Application Priority Data

Jan. 31, 1995 [EP] European Pat. Off. .............. 95830026

[51] Int. Cl.$^6$ .................................................. H03K 17/16
[52] U.S. Cl. .......................... 327/390; 327/365; 327/536
[58] Field of Search .............................. 307/110; 326/62, 326/80, 88; 327/333, 383, 390, 589, 365, 374, 376, 389, 534, 535, 536, 537

[56] References Cited

U.S. PATENT DOCUMENTS 5,365,118  11/1994  Wilcox ................................... 327/390
5,514,994  5/1997  Sawada .................................. 327/390

FOREIGN PATENT DOCUMENTS 0 351 898  1/1990  European Pat. Off. ....... H03K 17/08
0 367 006  5/1990  European Pat. Off. ....... H03K 17/06

OTHER PUBLICATIONS

Lahaye, "La série SP–600, Circuits HT de commande en demi–pont," *Electronique Radio Plans*, No. 523, Jun. 1991, pp. 89–93.

*Primary Examiner*—Timothy P. Callahan
*Assistant Examiner*—Jeffrey Zweizig
*Attorney, Agent, or Firm*—David V. Carlson; Robert E. Mates; Seed and Berry LLP

[57] ABSTRACT

The invention relates to a charge-pump control circuit for a power transistor including a driver circuit connected to a first supply voltage through a diode and to a second voltage through a switch and a first load. The driver circuit is connected to the power transistor, and the power transistor is linked to a pump capacitor. The power transistor is connected between a further supply voltage and a second load. The control circuit of the invention further includes a control logic circuit connected between the first supply voltage and the second voltage. The control logic circuit is connected to the driver circuit and to the switch, and the switch is connected between the power transistor and the first load. The switch is also connected to the driver circuit, and to a circuit for checking the charged state of the pump capacitor which is connected between the switch and the control logic circuit.

20 Claims, 3 Drawing Sheets

DEVICE AND METHOD FOR CONTROLLING A POWER SWITCH

TECHNICAL FIELD

This invention relates to a power transistor control circuit of the charge-pump type that includes a device for checking the charged state of the pump capacitor.

More specifically, the invention concerns a charge-pump control circuit for a power transistor that comprises a driver circuit connected to a first supply voltage reference through a diode and to a second voltage reference through a load, said driver circuit being connected to the power transistor, and the power transistor, linked to a pump capacitor, is connected between a further supply voltage reference and the load.

BACKGROUND OF THE INVENTION

As is well known, control circuits of the charge-pump type are generally used in high-voltage applications that employ power transistors of the MOS type. Such circuits can provide, across the pump capacitor, a higher voltage than the supply voltage.

This higher voltage allows the driver circuit, which drives the power transistor, to be sufficiently powered to fully turn on the power transistor.

A basic requirement for proper operation of the circuit is that the pump capacitor Cb should be sufficiently charged before the driver circuit is turned on.

Most known solutions may be reduced to the scheme of operation depicted in FIG. 1.

Shown in FIG. 1 is a prior art control circuit which comprises a driver circuit PIL connected to a first supply voltage Vcc through a diode D' and to a ground reference voltage GND through a load resistance RL'.

The driver circuit PIL is input with a control signal Si, and has an output connected to a power transistor MP'.

The power transistor MP', in turn, is connected between a second supply voltage VH and the load resistance RL', in parallel with a pump capacitor Cb'.

By providing the load resistance RL', a low impedance toward ground can be achieved. This resistance RL', therefore, performs its charging (of Cb') function by virtue of a current, designated Ic' in FIG. 1, flowing therethrough.

While being in many ways advantageous, this solution still has a few drawbacks, the most serious being that with this type of circuit, current is absorbed through the load resistance RL' continually.

Furthermore, the circuit of FIG. 1 cannot provide for the capacitor Cb' to become sufficiently charged before any enable signal is applied to the input of the driver circuit PIL.

SUMMARY OF THE INVENTION

An object of this invention is to provide a control circuit for power transistors, which has appropriate structural and functional features to measure the charged state of the capacitor Cb' and correctly drive the driver circuit, thereby overcoming the limitations and drawbacks with which prior art circuits are beset.

One aspect of the invention makes the charge signal of the pump capacitor dominant over other circuit enable signals.

In summary, the control circuit of this invention allows the charging of the pump capacitor Cb to be completed before the driver circuit 1 is enabled.

BRIEF DESCRIPTION OF THE DRAWINGS

The features and advantages of a circuit according to this invention will be apparent from the following detailed description of an embodiment thereof, given by way of non-limitative example with reference to the accompanying drawings.

In the drawings.

DETAILED DESCRIPTION OF THE INVENTION

Figure 1:
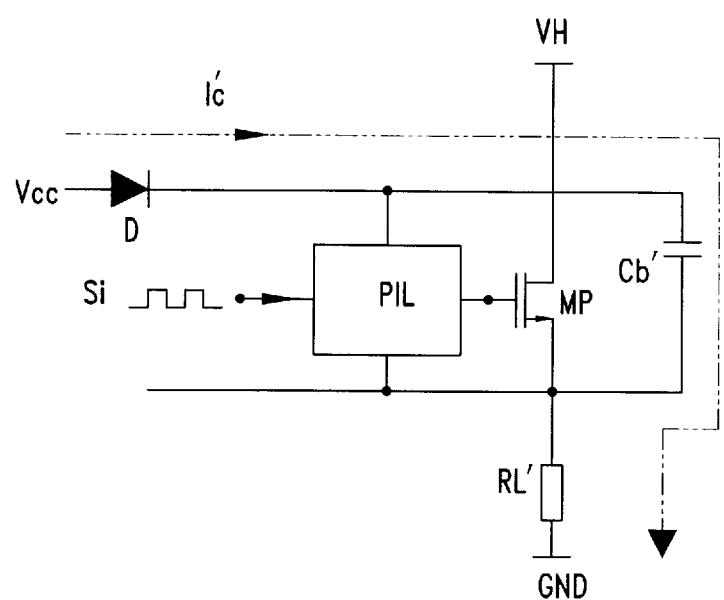
FIG. 1 shows in schematic form a charge-pump circuit according to the prior art.
Figure 2:
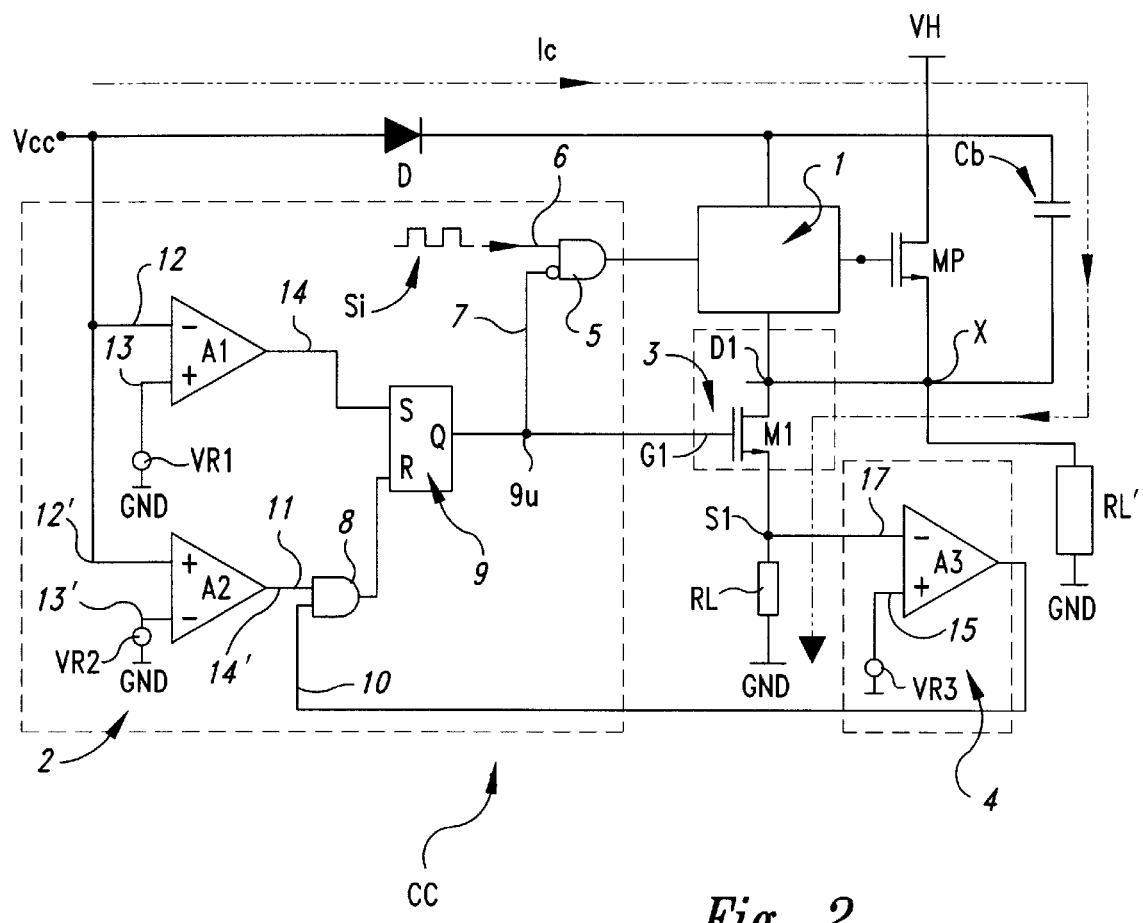
FIG. 2 shows in schematic form the control circuit of the present invention.

With reference in particular to the example shown in FIG. 2, generally denoted by the reference CC is a control circuit according to the invention.

The control circuit CC comprises a driver stage 1 connected between a first supply voltage Vcc and a second voltage reference, such as a signal ground GND. The driver stage 1 is connected to the first supply voltage reference Vcc through a diode D, and to ground GND through a load represented by a resistance RL.

The driver stage 1 is also connected to a power transistor MP of the MOS type. The power transistor MP, being linked to a pump capacitor Cb, is connected between a second supply voltage VH and the load resistance RL'.

Advantageously, in accordance with the invention, a switch 3, linked to a control logic 2, is connected between the driver circuit 1 and the load resistance RL.

This control logic 2 is connected between the first supply voltage Vcc and ground GND, and linked to the driver circuit 1 and to a circuit 4 for checking the charged state of the pump capacitor Cb, to be described.

Advantageously, in accordance with the invention, the switch 3 comprises a transistor M1 of the MOS type. The transistor M1 has its drain terminal D1 connected to the driver circuit 1 and to a common node X between the power transistor MP and the pump capacitor Cb.

The source terminal S1 of the transistor M1 is connected to ground GND through the load resistance RL, while the gate terminal G1 thereof is connected to an output 9u of the control logic 2.

The control logic 2 comprises a first logic gate 5 of the AND type having its output connected to the driver circuit 1. The first logic gate 5 receives, on a first input 6, a control signal Si for the driver circuit 1.

As depicted in FIG. 2, this control signal Si is typically a substantially square wave.

The control logic 2 further comprises a flip-flop 9, said flip-flop having its output terminal Q connected to a second input terminal 7 of the first logic gate 5 and to the gate terminal G1.

The input terminals S and R of the flip-flop 9 are coupled to respective outputs 14 and 14' of first and second comparators A1 and A2.

The first A1 and second comparators A2 have respective first input terminals 12 and 12' connected to the first supply voltage Vcc, and respective second input terminals 13 and 13' connected to respective generators of reference voltage VR1 and VR2.

The comparator A2 is connected to the input terminal R of the flip-flop 9 through a second logic gate 8 of the AND type. Specifically, the comparator A2 is connected to a first input terminal 11 of the second logic gate 8 connected, in turn, with its output to the input terminal R of the flip-flop 9.

The second input terminal 10 of the logic gate 8 is connected to the output of an additional comparator A3, which is incorporated into the circuit 4 for checking the charged state of the capacitor Cb.

The comparator A3 has a first input terminal 17 connected to the source terminal S1 of the transistor M1, and a second input terminal 15 connected to a generator of a reference voltage VR3.

The operation of the control circuit of this invention will now be described.

In the preferred embodiment, the reference voltage VR1 of the first comparator A1 is less than the reference voltage VR2 of the second comparator A2.

With this assumption, during the switching of the supply voltage Vcc, as the voltage Vcc drops below VR1, the output of the first comparator A1 goes to a high logic value LL1.

In a dual manner, the output of the second comparator A2 goes to a low logic value LL0. This low logic value is applied to the input terminal 11 of the AND logic gate 8 and holds a low logic value LL0 at the output terminal of that gate 8. Accordingly, the comparator A2 is called an under-voltage lockout comparator.

The high logic value LL1 is applied to the input terminal S (SET input) of the flip-flop 9, while the low logic value LL0 is applied to the input terminal R (RESET input) of that flip-flop 9.

Under these first conditions, the output terminal Q of the flip-flop 9 is in a high logic state LL1, and the MOS transistor M1, being driven by that high logic value LL1, closes the charging circuit of the pump capacitor Cb.

Throughout the capacitor Cb charging cycle, the power transistor MP is held in the off state. In fact, the output of the AND logic gate 5 which controls the driver stage 1 has a low logic value LL0, due to the output Q of the flip-flop 9 being inverted to the input 7 of the AND logic gate 5.

Figure 3:
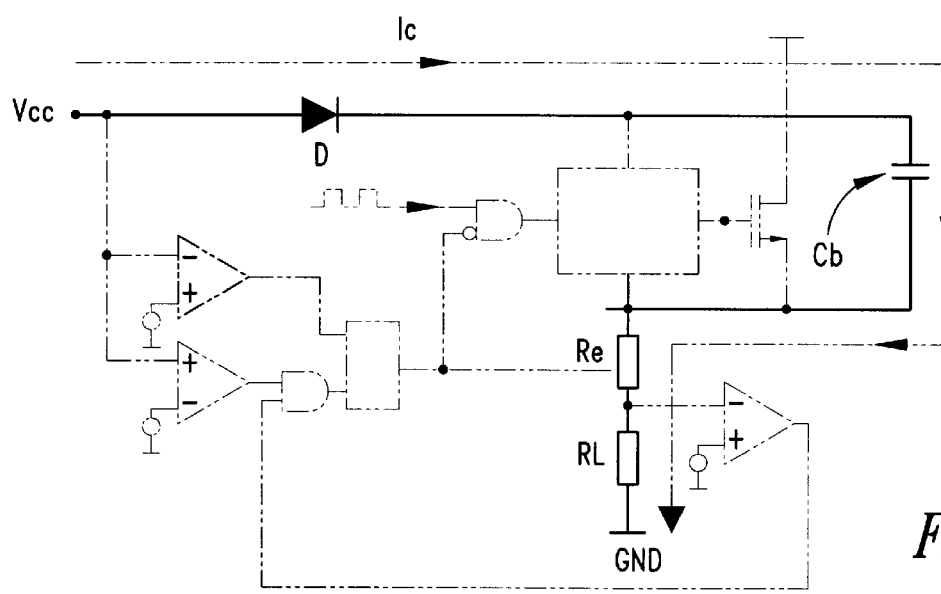
FIG. 3 shows an equivalent circuit of the circuit in FIG. 2.

The device operation under these conditions can be represented schematically by means of the equivalent circuit shown in FIG. 3.

In FIG. 3, the path of a charge current Ic through the capacitor Cb is shown by a dash-and-dot line. The current Ic flows through said capacitor Cb and a series of an equivalent resistance Re and the load resistance RL.

Therefore, the value of the charge current Ic will obey the following relationship:

$$I_c = \frac{Vcc - V_D}{R} * e^{-t/RCb}$$

where:
  $V_D$ is the voltage drop across the diode D, and
  R is the sum of the resistances Re and RL.

Thus, a charge voltage Vc exists across the capacitor Cb which is given by:

$$Vc = (Vcc - V_D) * (1 - e^{-t/RCb})$$

The value of the reference voltage VR3 for the comparator A3 is the lowest limit at which the capacitor Cb can be considered to be charged.

In fact, when the voltage across the load resistance RL decreases to the level of the voltage VR3, the output of the comparator A3 switches to a high logic value LL1 and enables the AND logic gate 8.

As the supply voltage Vcc exceeds the reference voltage VR1, the logic signal to the input terminal S of the flip-flop 9 goes to a low logic level LL0.

As Vcc exceeds the reference voltage VR2, the output signal 11 from the comparator A2 switches to a high logic level LL1. Through the AND logic gate 8, the terminal R of the flip-flop 9 goes to a high logic value LL1, if the output from the comparator A3 is also at a high logic value LL1.

Under these conditions, the signal at the output Q of the flip-flop 9 achieves a low logic level LL0. This low logic level LL0 is inverted at the input 7 of the AND logic gate 5 to re-enable the driver circuit 1 and disable the transistor M1.

The circuit of this invention may also be used with supply voltages Vcc higher than 500V. High supply voltage values are suitable to drive inductive loads that would require, however, a mechanism for preventing the parasitic bipolar transistors from turning on. When used with high Vcc voltages, for example Vcc = 500V, the circuit CC includes conventional circuitry (not shown) for protecting and providing an appropriate supply voltage to comparators A1, A2, and A3, flip-flop 9, gates 5 and 8, and any other associated circuitry.

Figure 4:
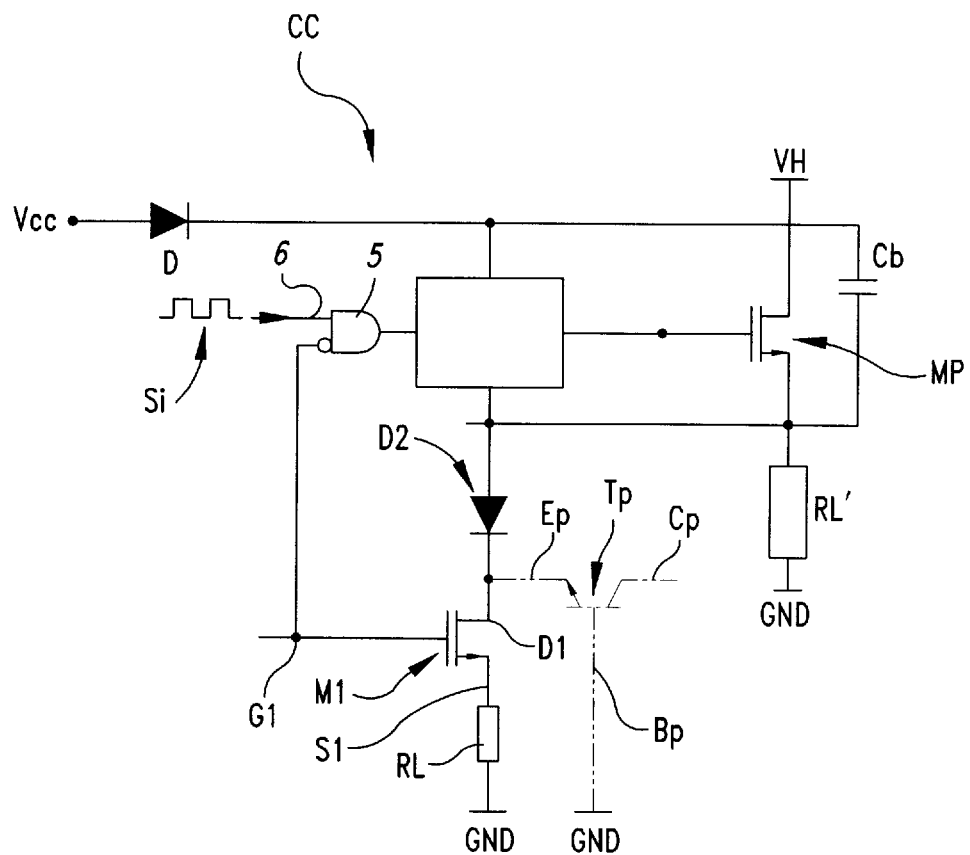
FIG. 4 shows schematically a modified embodiment of the inventive circuit.

To prevent turning on such parasitic transistors, the circuit of this invention can be modified as shown in FIG. 4.

Advantageously, in this second embodiment of the inventive control circuit, a second diode D2 is connected between the driver circuit 1 and the drain terminal D1 of the transistor M1 included in the switch 3.

Also shown in phantom lines in FIG. 4 is a parasitic transistor Tp bound to the load RL'. The parasitic transistor Tp is of the NPN type, and has its emitter terminal Ep connected to the drain terminal D1 of the transistor M1, and its base terminal Bp connected to ground GND.

The diode D2 inhibits current backflow through that parasitic transistor Tp, thereby preventing it from turning on.

In summary, the control circuit of this invention allows the charging of the pump capacitor Cb to be completed before the driver circuit 1 is enabled.

Thus, the charged state of the pump capacitor Cb is, in fact, dominant over any other enable signals.

Thus, the use of the control circuit of this invention will ensure that the power transistor MP is properly powered at all times, by preventing it from turning on whenever the operating conditions are not correct (e.g., an under-threshold condition).

Advantageously, the circuit of this invention also prevents, in an alternative embodiment thereof, any parasitic transistors in parallel with the load RL' from turning on.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit for controlling, with assistance from a boost capacitor, a power transistor having control and drive terminals, said circuit comprising:
   a first boost-capacitor terminal coupled to said drive terminal;
   a first current-flow control circuit coupled between a first power supply terminal and a second boost-capacitor terminal;

a drive circuit having an output coupled to said control terminal, a first supply terminal coupled to said first boost-capacitor terminal, a second supply terminal coupled to said second boost-capacitor terminal, and an input;

a control logic circuit having an input terminal coupled to receive a control signal, an output coupled to said input of said drive circuit, a control input, and a control output, said control logic circuit operable to disable said drive circuit until said boost capacitor is charged to a desired value;

a charge circuit having an input coupled to said first boost-capacitor terminal, a sense output, and a control input coupled to said control output of said control logic circuit; and a charge measuring circuit having an input coupled to said sense output, and having an output coupled to said control input of said control logic circuit.

2. The circuit of claim 1 wherein said first current-flow control circuit comprises a diode having an anode coupled to said first power supply terminal and having a cathode coupled to said second boost-capacitor terminal.

3. The circuit of claim 1 wherein said charge circuit comprises:

a switch having a control terminal coupled to said control output of said control logic circuit, a first terminal coupled to said first boost-capacitor terminal, and a second terminal coupled to said sense output; and a load device coupled between said sense output and a voltage reference.

4. The circuit of claim 1 wherein said charge measuring circuit comprises:

a first reference-voltage generator; and a comparator having a first input coupled to said sense output, a second input coupled to said first reference voltage generator, and an output coupled to said control input of said control logic circuit.

5. The circuit of claim 1, further comprising a second current-flow control circuit coupled between said first boost-capacitor terminal and said input of said charge circuit.

6. The circuit of claim 1 wherein said control logic circuit comprises:

second and third reference-voltage generators;

a first comparator having a first input coupled to said first power supply terminal, a second input coupled to said second reference-voltage generator, and an output;

a second comparator having a first input coupled to said first power supply terminal, a second input coupled to said third reference-voltage generator, and an output;

a first logic gate having an input coupled to said output of said second comparator, a control input coupled to said output of said charge measuring circuit, and an output;

a bistable circuit having a first input coupled to said output of said first comparator, a second input coupled to said output of said first logic gate, and a control output coupled to said control input of said charge circuit; and a second logic gate having a first input coupled to said control output of said bistable circuit an input terminal coupled to receive said control signal, and an output coupled to said input of said drive circuit.

7. A method for controlling a power switch, comprising:

charging to a predetermined voltage level a pump capacitor associated with said power switch; and enabling said power switch.

8. The method of claim 7, further comprising the act of monitoring said pump capacitor to determine when said pump capacitor attains said predetermined voltage level.

9. A circuit for switching a power transistor that is associated with a boost capacitor, said circuit comprising:

a drive circuit coupled to said power transistor and to said boost capacitor, said drive circuit operable to switch said power transistor between a conducting state and a substantially nonconducting state; and control circuitry coupled to said drive circuit, said control circuitry operable to charge said boost capacitor to a predetermined charge level and to enable said drive circuit to switch said power transistor to said conducting state when said boost capacitor has said predetermined charge level.

10. The circuit of claim 9 wherein said control circuitry is further operable to enable said drive circuit in response to an input signal.

11. A charge-pump control circuit for a power transistor, comprising a driver circuit coupled to a first supply voltage reference through a diode and to a second voltage reference through a first load, said driver circuit being connected to the power transistor, the power transistor being linked to a pump capacitor and being connected between a further supply voltage reference and a second load, and a control logic circuit connected between the first supply voltage reference and the second voltage reference, said control logic circuit being connected to said driver circuit and to a switch, said switch being coupled between said power transistor and said first load and being coupled to the driver circuit, and a circuit for checking a charged state of said pump capacitor coupled between said switch, the second voltage reference, and the control logic circuit.

12. A control circuit according to claim 11 wherein said control logic circuit comprises a first logic gate of the AND type adapted to receive, on a first input terminal, a control signal for the driver circuit.

13. A control circuit according to claim 12 wherein said control signal is substantially a square wave signal.

14. A control circuit according to claim 12 wherein said control logic circuit further comprises first and second comparators a second logic gate of the AND type, and a flip-flop, said flip-flop having an output terminal connected to a second input terminal of said first logic gate.

15. A control circuit according to claim 14 wherein said flip-flop has first and second input terminals, said first input terminal being connected to an output of said first comparator and said second input terminal being coupled to an output of the second comparator through said second logic gate.

16. A control circuit according to claim 14 wherein said second logic gate has a first input terminal connected to said circuit for checking a charged state of said pump capacitor and a second input terminal connected to an output of said second comparator.

17. A control circuit according to claim 16 wherein said first and second comparators have respective first input terminals connected to said first supply voltage reference and respective second input terminals connected to respective generators each generator being structured to generate a reference voltage.

18. A control circuit according to claim 11 wherein said switch comprises a transistor of a MOS type having a drain terminal coupled to said driver circuit and to a common node between the power transistor and the pump capacitor, a gate terminal connected to said control logic circuit, and a source terminal connected to said first load.

19. A control circuit according to claim 11 wherein said circuit for checking a charged state of said pump capacitor comprises a comparator having a first input terminal connected to the first load and a second input terminal connected to a generator of a reference voltage.

20. A control circuit according to claim 18 wherein said switch further comprises a diode connected between said MOS transistor and said driver circuit.

* * * * *